(12) United States Patent
Walling

(10) Patent No.: US 6,259,256 B1
(45) Date of Patent: Jul. 10, 2001

(54) CABLE TESTING APPARATUS

(75) Inventor: Jörg-Hein Walling, Beaconsfield (CA)

(73) Assignee: Nordx/CDT, Inc., Pointe-Claire (CA)

( * ) Notice: Subject to any disclaimer, the term of this patent is extended or adjusted under 35 U.S.C. 154(b) by 0 days.

(21) Appl. No.: 09/259,945

(22) Filed: Mar. 1, 1999

(51) Int. Cl.[7] ................................................. H01H 31/02
(52) U.S. Cl. ................................................ 324/539; 324/537
(58) Field of Search .................................. 324/539, 540, 324/642, 628, 616, 537

(56) References Cited

U.S. PATENT DOCUMENTS

| | | |
|---|---|---|
| 5,414,343 | 5/1995 | Flaherty et al. ........................ 324/66 |
| 5,502,391 | 3/1996 | Sciacero et al. . |
| 5,530,367 | 6/1996 | Bottman . |
| 5,532,603 | 7/1996 | Bottman . |
| 5,539,321 | 7/1996 | Sciacero et al. . |
| 5,559,427 | 9/1996 | Hinds et al. ............................. 324/66 |
| 5,598,342 | 1/1997 | Siemon et al. . |
| 5,677,633 | 10/1997 | Moser et al. . |
| 5,677,847 | * 10/1997 | Walling ................................ 324/539 |

* cited by examiner

*Primary Examiner*—Safet Metjahic
*Assistant Examiner*—E P LeRoux
(74) *Attorney, Agent, or Firm*—Wolf, Greenfield & Sacks, P.C.

(57) ABSTRACT

A cable testing device apparatus has been developed so as to measure the NEXT and ELFEXT characteristics of a cable containing a plurality of twisted pairs. In particular, the present invention simultaneously provides each twisted pair within the cable with an electrical signal of equal magnitude and measuring the equivalent power sum output for each of the individual twisted pairs within the cable. Thus, a total of 25 measurements for each test are needed, for a total of 50 tests.

17 Claims, 3 Drawing Sheets

CABLE TESTING APPARATUS

BACKGROUND OF THE INVENTION

1. Field of the Invention

The present invention relates to cable testing devices and, more particularly, the present invention relates to a cable testing apparatus capable of testing a cable faster and utilizing fewer measurements than conventional cable testing devices.

2. Related Art

High speed data communications cables in current usage include pairs of wire twisted together forming a balanced transmission line. Such pairs of wire are referred to as twisted pairs.

One common type of conventional cable for high-speed data communications includes multiple twisted pairs. In each pair, the wires are twisted together in a helical fashion forming a balanced transmission line. When twisted pairs are placed in close proximity, such as in a cable, electrical energy may be transferred from one pair of the cable to another. Such energy transfer between pairs is undesirable and is referred to as crosstalk. Crosstalk causes interference to the information being transmitted through the twisted pair and can reduce the data transmission rate and can cause an increase in the bit error rate. The Telecommunications Industry Association (TIA) and Electronics Industry Association (EIA) have defined standards for crosstalk in a data communications cable including: TIA/EIA-568-A, published Oct. 24, 1995; TIA/EIA 568-A-1 published Sep. 25, 1997; and TIA/EIA 568-A-2, published Aug. 14, 1998. The International Electrotechnical Commission (IEC) has also defined standards for data communications cable crosstalk, including ISO/IEC 11801 that is the international equivalent to TIA/EIA 568-A. One high performance standard for data communications cable is ISO/IEC 11801, Category 5.

It is desirable that these high speed data communication cables, as well as the newly-emerging class of broadband cables based upon twisted pair technology are tested to ensure compliance with the various standards in a cost-effective and accurate manner. Testing a cable characterizes a cable using various measurements including: the attenuation of a particular twisted pair, the crosstalk between twisted pairs contained within the cable, and the impedance of each individual twisted pair. These measurements are generally performed using a network analyzer that may include a S-parameter test set. As used herein, a network analyzer includes cable testing devices utilizing a network analyzer individually or a network analyzer in combination with an S-parameter test set.

In conventional cable testing devices, each twisted pair or combination of twisted pairs is connected to the corresponding ports of the network analyzer test set. Conventionally, the network analyzers operate in an unbalanced operational mode and therefore require the use of balun transformers to drive the twisted pair cable in a balanced mode. Some conventional cable testing devices use a switch matrix to connect each twisted pair or twisted pair combination to the port of the network analyzer. The switch matrix may be placed on either the unbalanced side, i.e., between the network analyzer and the balun, or the balanced side of the balun, i.e., between the balun and the twisted pairs under test.

In order to quantify the level of crosstalk occurring between twisted pairs contained within the cable, the power-sum crosstalk for each pair, that is, the vectorially-added power induced by all the adjacent disturbing twisted pairs into the twisted pair being measured, must be determined. Thus, in conventional testers for each twisted pair, all of the possible pair combinations will have to be measured in order to determine the power sum crosstalk.

There are two forms of crosstalk measured in cable testing devices. The first is near-end crosstalk (NEXT). NEXT is measured in conventional devices by using a network analyzer as described above for each twisted pair within the cable. For a cable having 25 twisted pairs, the number of combinations of 25 twisted pairs taken 2 at a time means that 300 measurements must be made. Similarly, far end crosstalk (ELFEXT) is conventionally measured using a network analyzer also for each pair of cables. Similarly, this means that there will be an additional 300 combinations of the 25 twisted pairs taken 2 at a time to properly characterize the ELFEXT of the cable. Thus, in conventional cable testing devices, to properly characterize the twisted pairs within the cable for the NEXT and ELFEXT measurements, a total of 600 measurements are needed. Performing 600 measurements requires a substantial amount of time and concomitantly increases the cost of producing the cable.

What is needed, therefore, in the art is a cable testing apparatus that is able to perform the NEXT and ELFEXT measurements faster and easier than conventional methods.

SUMMARY OF THE INVENTION

According to the present invention, a cable testing apparatus has been developed so as to measure the NEXT and ELFEXT characteristics of a cable containing a plurality of twisted pairs that is faster and less expensive than the conventional devices.

In particular, the present invention overcomes the deficiencies of the conventional cable testing devices by providing each twisted pair within the cable simultaneously an electrical signal of equal magnitude and measuring the equivalent power sum output for each of the individual twisted pairs within the cable. Thus, a total of 25 measurements for each test are needed, for a total of 50 tests.

One embodiment of the cable testing device includes a signal source for providing a signal with a predetermined power, a power divider electrically coupled to the signal source and electrically coupled to the plurality of twisted wire pairs contained within a cable under test. Each of the plurality of twisted wire pairs receives an electrical signal and each of the electrical signals has substantially the same power. A measuring device is connected to at is least one of the plurality of twisted pairs within the cable and measures the power sum, i.e., the vectorial combination of each of the crosstalk components coupled to the twisted pair being measured from all other twisted pairs within the cable.

In another embodiment, the cable testing device can include a plurality of balun transformers electrically connected in series between the power divider and the plurality of twisted wire pairs contained within the cable under test. In an alternative embodiment, the signal source and measuring device are contained within a network analyzer. In one embodiment, the network analyzer provides the signal as a balanced signal and in an alternative embodiment the network analyzer provides the signal as an unbalanced signal.

In another embodiment of the present invention, the power divider contains active electronic components. In an alternative embodiment, the power divider contains only passive components.

In another aspect of the present invention, the cable device tester includes a network analyzer for providing a measurement signal and for measuring a return signal coupled to a switch matrix having a signal input and measured signal output coupled to the signal supply and measurement input respectively of the network analyzer, the switch matrix further including a plurality of outputs, each output coupled to a power/splitter/amplifier that provides for an equalized power level for each input signal. The power/splitter/amplifier has a plurality of outputs coupled to a second switch matrix, the second switch matrix having a plurality of outputs, where each output is coupled to a single twisted pair contained within the cable under test.

In another aspect of the present invention, a multiple power amplifier having a common input and equal output signal power is coupled to at least one power splitter/divider, where the power splitter/divider has a plurality of output, where each output is coupled to an individual twisted pair within the cable under test.

BRIEF DESCRIPTION OF THE DRAWINGS

The objects, features and advantages of the present invention will become more apparent in view of the following detailed description of the invention when taken in conjunction with the figures in which like-numbered elements are the same.

DETAILED DESCRIPTION OF PREFERRED EMBODIMENTS

The total level of crosstalk for a given twisted pair can be described as of the vectorial combination of all crosstalk sources. Thus, the total crosstalk, also known as the powersum crosstalk, for the given pair is found by energizing all other pairs while measuring the signal returned in the given pair. This means that a single measurement of each twisted pair can provide the total crosstalk measurement for that pair.

Figure 1:
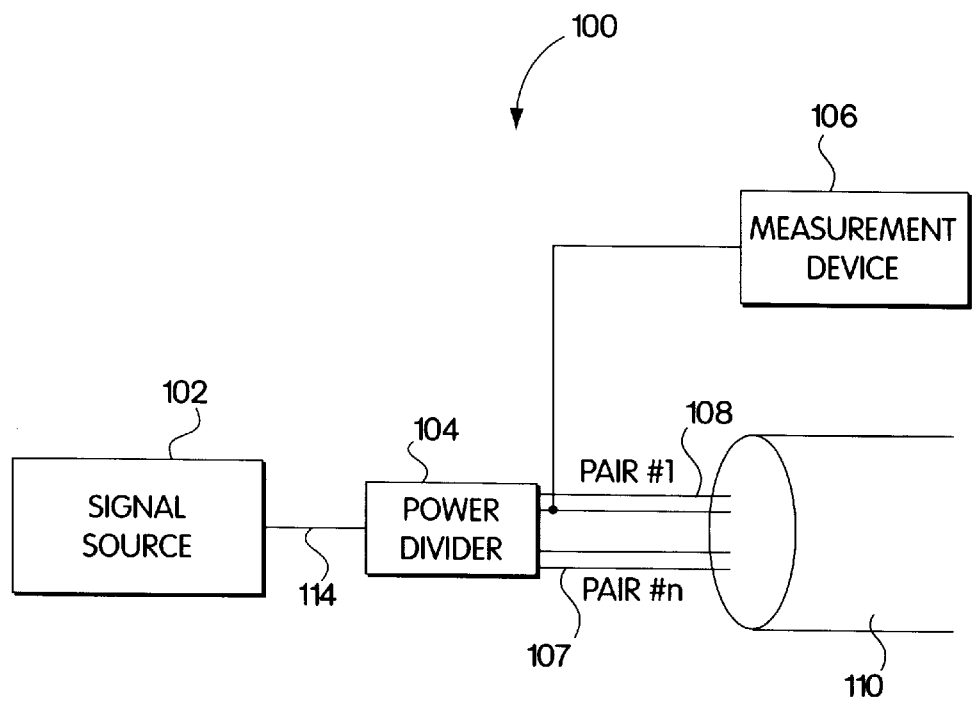
FIG. 1 is a schematic block diagram view of a cable testing apparatus according to one aspect of the present invention.

In one aspect of the present invention shown in FIG. 1, a cable testing apparatus 100 is disclosed. The cable testing apparatus 100 includes a signal source 102 having a signal output 114 coupled to an input of power divider 104. The signal output 114 is selected to have a frequency, waveform characteristics, and power level chosen in concert with the testing requirements and cable characteristics. The power divider 104 has a plurality of outputs, each having a substantially similar power level, coupled to a plurality of conductors 108 within a cable under test 110. A measurement device 106 is coupled to an individual conductor 108 and provides a signal indicative of the crosstalk power-sum level 112 that exists within the conductor 108. The power divider 104 can be of a conventional design as would be known to those of ordinary skill in the art. In one embodiment, the power divider 104 can include only passive components, in which case, the power level output to the conductors 108 will be inversely proportional to the number of conductors 108 to which power is being applied. The power divider 104, by utilizing only passive components, will add to the total attenuation of the system and will have to be taken into account when calculating the parameters. This added attenuation is due to passive components providing no amplification. Alternatively, the power divider 104 can include active components, so that the output power level can be set to any desired value. This may be necessary since different lengths of cables will have different values of signal attenuation and may require different power settings to achieve accurate, repeatable, and consistent results. In one embodiment of the present invention, the plurality of conductors 108 are twisted pairs. In another embodiment the wires 108 can be coaxial cables grouped together within a larger cable, or optical fibers grouped together within an optical fiber cable.

Figure 2:
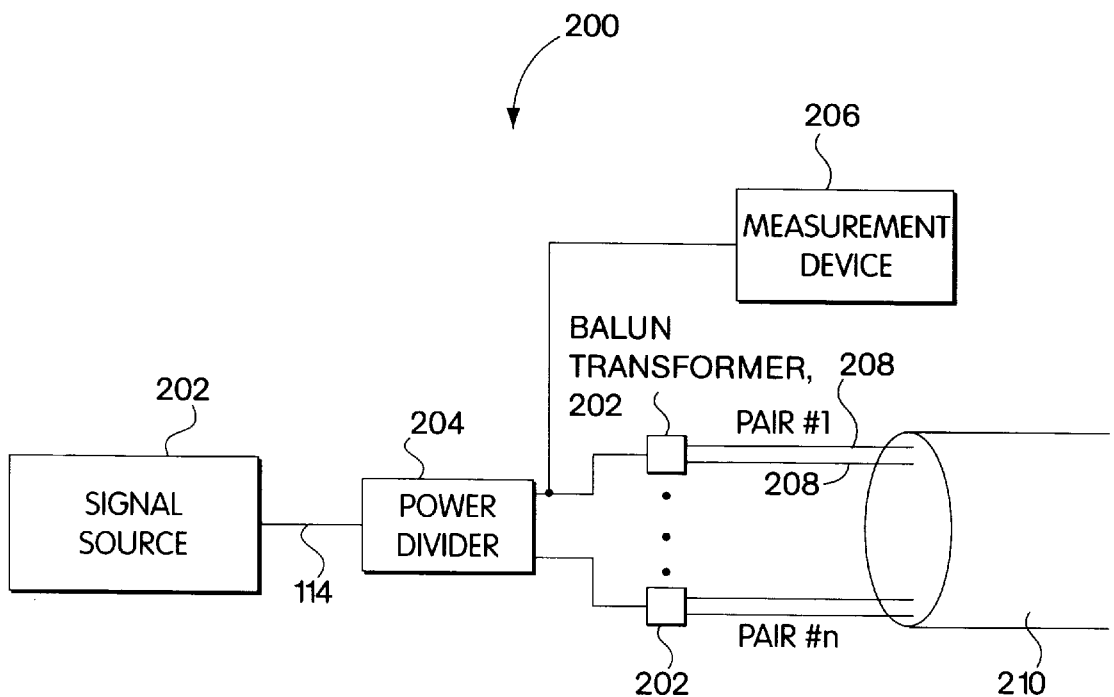
FIG. 2 is a schematic block diagram of one embodiment of a cable testing device.

Another aspect of the present invention is shown in FIG. 2. Cable testing apparatus 200 includes a balun transformer 202 in series between the power divider 204 and the conductors 208. In one embodiment the wires 208 are twisted pairs operating using balanced signals. The output provided from the power divider 204 can be an unbalanced signal that is converted by the balun transformers 202 into a balanced signal to properly drive the twisted pair, 208. The balun transformers 202 can also convert a balanced signal to an unbalanced signal as well. The measurement device 206 in one embodiment measures unbalanced measurement signals so that the measurement device 206 should be placed in series between the power divider 104 and the balun transformer 202. Alternatively, if the measurement device 106 measures a balanced signal, then the measurement device should be placed in series with the balun transformer 202 and the twisted pairs 108.

In of the above embodiments the measurement devices 106 and 206, can measure only a single twisted pair 108, 208 at a time. Because of this, the system is powered down and the measurement device 106 and 206 manually disconnected and reconnected to measure the next.

Figure 3:
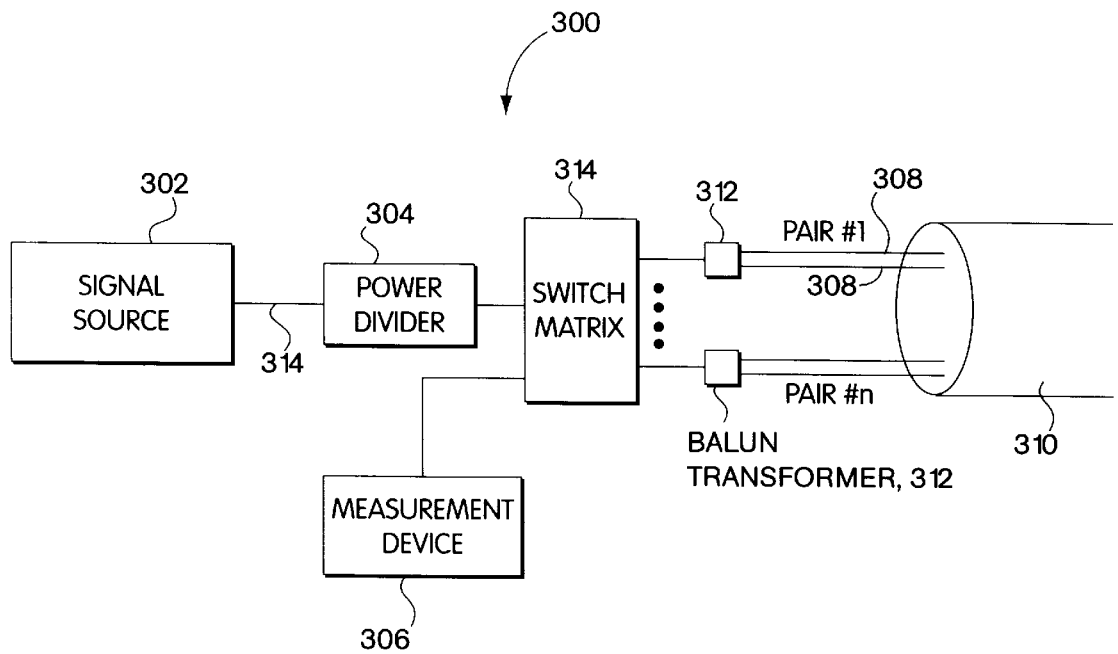
FIG. 3 is a schematic block diagram of another embodiment of a cable testing device.
Figure 4:
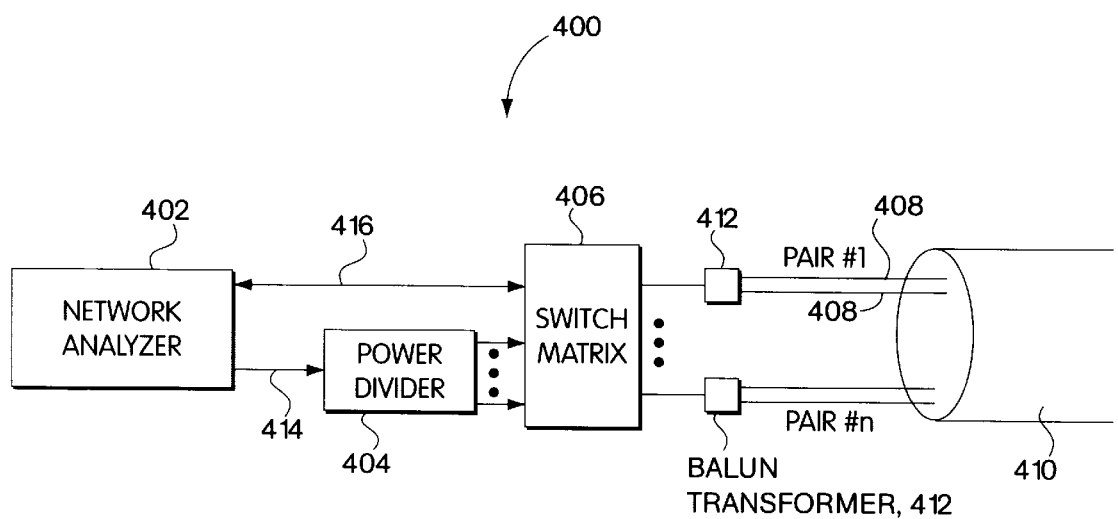
FIG. 4 is a schematic block diagram of another embodiment of a cable testing device.

Another aspect of a cable testing apparatus is shown in FIG. 3. FIG. 3 discloses a cable testing apparatus 300 including a switch matrix 314 which is placed in series between the power divider 304 and the balun transformers 312 driving the twisted pairs 308. The switch matrix 314 provides for a selected twisted pair 308 to be electrically coupled to the measurement device 306. By electrically coupling different twisted pairs to the measurement device, there is no need to disconnect the power to take a new measurement. Thus, a single measurement device 306 can be used. In another embodiment, the switching matrix 312 may be of the type that is able to switch balanced waveforms. In such an embodiment, a balun transformer 312 would be placed in series between the plurality of the outputs of the power divider 104 and the inputs to the switch matrix 302 (not shown). A suitable switch matrix 314 capable of switching balanced signals is known in the art, however, as known, it is difficult to maintain a high degree of symmetry during the switching of balanced signals. This lack of symmetry can produce an unbalanced signal. In one preferred embodiment of the present invention, the switch matrix 312 switches the unbalanced signals. FIG. 4 discloses another aspect of the present invention. FIG. 4 shows a cable testing apparatus 400 including a network analyzer 402 for providing both signal output 114 and an input to a measuring device 310 that is built within the network analyzer 402. The network analyzer typically provides an unbalanced signal output 414. A power divider 404 receives the output signal 414 and as described above, produces a plurality of signals having substantially the same power level to a switch matrix 406. The switch matrix provides a plurality of balun transformers 412 with an unbalanced signal that the balun transformers 412 convert into a balanced signal. This balanced signal is provided to the plurality of twisted pairs 408 The switch matrix 406 can also provide an output that may be selected and electrically coupled to an output 416 that provides the measurement input 514 to the network analyzer 402.

Figure 5:
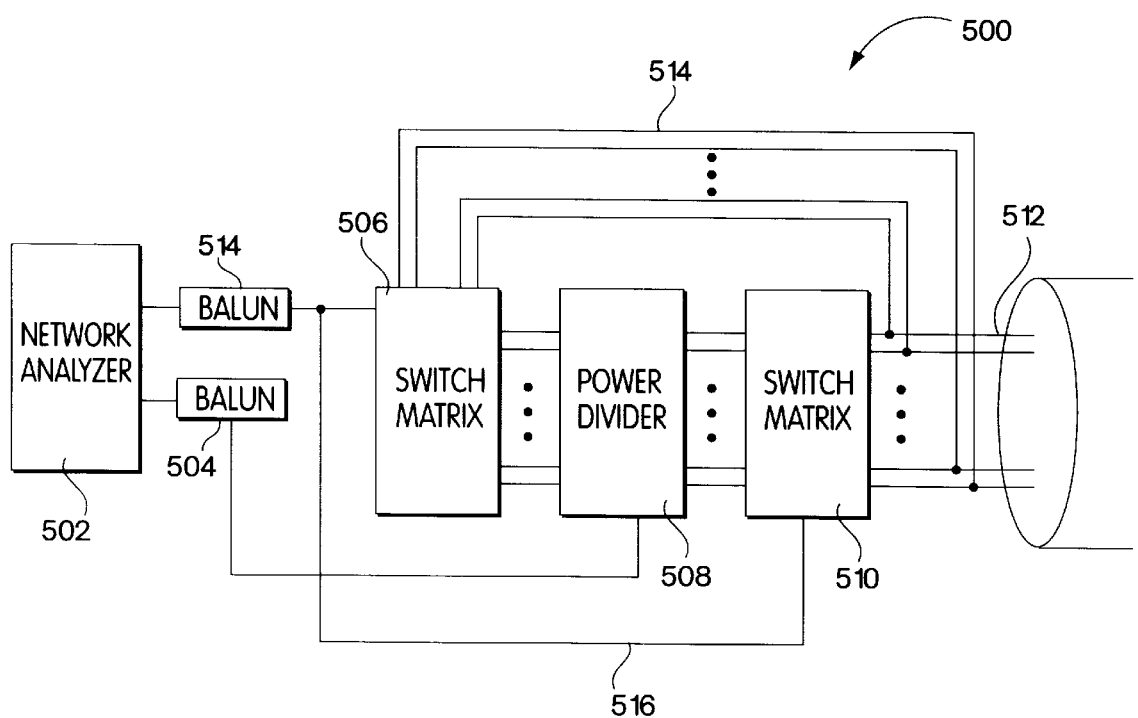
FIG. 5 is a schematic block diagram of yet another embodiment of a the cable testing device.

FIG. 5 illustrates another embodiment of the cable testing apparatus. Cable testing apparatus 500 includes a network analyzer 502 providing a power signal to a balun transformer 504 that provides a balanced power signal to a power divider 508. The power divider provides a plurality of testing signals, all of which have substantially similar power levels. The plurality of testing signals is then supplied to a second switch matrix 510. For measuring near end crosstalk, the second switch matrix 510 provides a balanced testing signal to all of the twisted pairs 412 except for the pair that is being measured. The return signal for the pair that is being measured is provided to the first switch matrix by cables 515 through balun 514 to the network analyzer 502. If an unbalanced measurement signal is desired, the balun 514 is unnecessary.

To measure far end cross talk, a network analyzer 502 provides a power signal to the balun transformer 504 that provides a balanced power signal to a power divider 508. The power divider 508 provides a plurality of testing signals, all of which have substantially similar power levels. The plurality of testing signals is then supplied to a second switch matrix 510. The second switch matrix provides a balanced testing signal to all of the pairs under test 512. The cables 514 connecting the cables under test to a first switch matrix 506 that provides a terminating impedance for the cables. The measurement signal is provided to the network analyzer 502 via balun 514, and cable 516 from the second switch matrix 510.

The present invention has now been described in connection with a number of specific embodiments thereof. However, numerous modifications which are contemplated as falling with in the scope of the present invention should now be apparent to those skilled in the art. Therefore, it is intended that the scope of the present invention be limited only by the scope of the claims appended hereto.

What is claimed is:

1. An apparatus for measuring characteristics among a plurality of conductors within a cable under test comprising:
    a signal source providing a signal having a predetermined power at said output;
    a signal divider providing a plurality of measurement signals each having a substantially same power level;
    each of said plurality of measurement signals being electrically coupled to one of the plurality of conductors within the cable under test;
    a measurement device electrically coupled to at least one of the plurality of conductors to measure at least one characteristic thereof.

2. The apparatus as in claim 1 further comprising:
    a plurality of baluns electrically coupled to the plurality of measurement signals for converting an unbalanced measurement signal into a balanced measurement signal and providing the balanced signal to the plurality of conductors.

3. The apparatus as in claim 1 wherein said signal source and said measurement device are contained within a network analyzer.

4. The apparatus as in claim 1 wherein said signal divider includes active electronic devices.

5. The apparatus as in claim 1 wherein said signal divider includes passive electronic components.

6. The apparatus as in claim 1 wherein said test signal is an unbalanced signal.

7. The apparatus as in claim 1 wherein said test signal is a balanced signal.

8. The apparatus as in claim 1 wherein said plurality of measurement signals are unbalanced signals.

9. The apparatus as in claim 1 wherein said plurality of measurement signals are balanced signals.

10. An apparatus for measuring at least one characteristic of a plurality of conductors within a cable under test comprising:
    a network analyzer providing a test signal and having a return measurement device;
    a signal divider receiving said test signal from said network analyzer and providing a plurality of measurement signals having a substantially similar power level;
    a first switch matrix, receiving the plurality of measurement signals;
    said first switch matrix further including a plurality of outputs, each of said plurality of outputs being electrically coupled to a corresponding one of the plurality of conductors within the cable under test;
    each of the plurality of conductors providing a plurality of return measurement signals;
    said first switch matrix receiving the plurality of return measurement signals and providing a selected one of the plurality of return measurement signals to the return measurement device for measuring at least one characteristic of the conductors contained within the cable under test.

11. The apparatus as in claim 10 further comprising, a plurality of balun transformers in series between said output of said first switch matrix and the plurality of twisted wire pairs contained within the cable under test, for converting an unbalanced measurement signal into a balanced measurement signal.

12. The apparatus as in claim 10 wherein said signal divider includes active electronic devices.

13. The apparatus as in claim 10 wherein said signal divider includes passive electronic components.

14. The apparatus as in claim 10 wherein said plurality of measurement signals are balanced signals.

15. The apparatus as in claim 10 wherein said plurality of measurement signals are unbalanced signals.

16. The apparatus as in claim 10 wherein said test signal is balanced.

17. The apparatus as in claim 10 wherein said test signal is unbalanced.

* * * * *